US008980006B2

(12) United States Patent
Huh et al.

(10) Patent No.: US 8,980,006 B2
(45) Date of Patent: Mar. 17, 2015

(54) APPARATUS FOR CHEMICAL VAPOR DEPOSITION

(75) Inventors: Yun-Sung Huh, Anyang-si (KR); Seung-Il Park, Cheonan-si (KR)

(73) Assignee: DMS Co., Ltd., Gyeonggi-Do (KR)

( * ) Notice: Subject to any disclaimer, the term of this patent is extended or adjusted under 35 U.S.C. 154(b) by 826 days.

(21) Appl. No.: 13/217,423

(22) Filed: Aug. 25, 2011

(65) Prior Publication Data

US 2012/0174866 A1   Jul. 12, 2012

(30) Foreign Application Priority Data

Jan. 11, 2011  (KR) .................. 10-2011-0002779

(51) Int. Cl.
*C23C 16/455*   (2006.01)

(52) U.S. Cl.
CPC ..... *C23C 16/45565* (2013.01); *C23C 16/45559* (2013.01)
USPC .................. 118/715; 156/345.33; 156/345.34

(58) Field of Classification Search
CPC ............ C23C 16/455; C23C 16/45563; C23C 16/45565; C23C 16/45568; C23C 16/4557; C23C 16/45572; C23C 16/45573; C23C 16/45576; C23C 16/45527; C23C 16/45534; C23C 16/45536; C23C 16/45542; C23C 16/45538; C23C 16/4554; C23C 16/45553; C23C 16/45; H01J 37/3244; H01L 21/3141; H01L 21/31604
USPC .......................... 118/715; 156/345.33, 345.34
See application file for complete search history.

(56) References Cited

U.S. PATENT DOCUMENTS

| 2003/0140851 A1 | 7/2003 | Janakiraman et al. |
| 2010/0037823 A1 | 2/2010 | Cho et al. |
| 2010/0136216 A1 | 6/2010 | Tsuei et al. |

FOREIGN PATENT DOCUMENTS

CN          1669796 A       9/2005

OTHER PUBLICATIONS

Chinese Office Action dated Dec. 4, 2013.
Office Action dated Dec. 10, 2012 issued by Korean Intellectual Property Office for Korean Application No. 10-2011-0002779.

*Primary Examiner* — Jeffrie R Lund
*Assistant Examiner* — Satish Chandra
(74) *Attorney, Agent, or Firm* — Locke Lord LLP; Jeffrey D. Hsi

(57) ABSTRACT

An apparatus for chemical vapor deposition is disclosed. An aspect of the present invention provides an apparatus for chemical vapor deposition that includes: a process chamber configured to demarcate a reaction space; a back plate placed above the reaction space and having a gas inlet in a middle thereof; a gas diffusion member arranged below and separated from the gas inlet and coupled to the back plate by a first coupling member and configured to diffuse process gas supplied through the gas inlet; a shower head placed below and separated from the back plate and the gas diffusion member and having a middle part thereof coupled to the gas diffusion member by a second coupling member and having a plurality of spray holes perforated therein; and a susceptor arranged below and separated from the shower head and supporting a substrate. The gas diffusion member has a plurality of gas guiding holes that vertically penetrate the gas diffusion member such that the process gas supplied through the gas inlet is diffused toward a lower side of the gas diffusion member.

25 Claims, 10 Drawing Sheets

APPARATUS FOR CHEMICAL VAPOR DEPOSITION

CROSS-REFERENCE TO RELATED APPLICATIONS

This application claims the benefit of Korean Patent Application No. 10-2011-0002779, filed with the Korean Intellectual Property Office on Jan. 11, 2011, the disclosure of which is incorporated herein by reference in its entirety.

TECHNICAL FIELD

The present invention is related to an apparatus for chemical vapor deposition.

BACKGROUND ART

Methods for forming a thin film on an object can be generally divided into Physical Vapor Deposition (PVD) methods, such as sputtering, in which a thin film is formed in such a way that the physical properties of a deposition source and the physical properties of a thin film material are identical, and Chemical Vapor Deposition (CVD) methods, in which a thin film is formed using a chemical reaction in such a way that the physical properties of a deposition source and the physical properties of a thin film material are different.

However, The CVD methods are more commonly used because the PVD methods have the uniformity of composition or thickness and the step coverage that are not as good as those of the CVD methods. The CVD methods include the APCVD (Atmospheric Pressure CVD) method, the LPCVD (Low Pressure CVD) method, the PECVD (Plasma Enhanced CVD) method, etc.

Among the CVD methods, The PECVD method has been recently used widely, owing to its capabilities of low temperature deposition and fast forming of a thin film. The PECVD method refers to a method in which RF power is applied to reaction gas injected into a reaction chamber to make the reaction gas in a state of plasma and radicals in the plasma are made to be deposited on a wafer or glass substrate.

No matter which method is adopted, uniform deposition of thin film is the most key to a thin film deposition process, and thus a large number of improvement ideas have been suggested for this. For uniform deposition of thin film, uniform distribution of reaction gas or plasma plays a very important role.

A PECVD apparatus is equipment that is indispensable in a thin film process, and the scale of the PECVD apparatus has been gradually increasing due to the large scales of required yield. For instance, the PECVD apparatus used in a recent process for manufacturing flat-screen display devices is extra-large with the size of one side being easily over 2 meters, and thus it is required that its detailed functions be configured to be more precise in order to obtain a thin film of a desired quality.

The present invention suggests ideas for improving the function of spraying the gas and minimizing the warping phenomenon caused by thermal expansion of a gas spray surface, in order to make the thickness of a thin film uniform inside a PECVD apparatus for manufacturing a large-surface thin film.

FIG. 1 illustrates a brief configuration of a general PECVD apparatus, and described below with reference to FIG. 1 are processes using the PECVD apparatus.

First, once a substrate 3 is safely received on an upper surface of a susceptor 2, which is installed inside a reaction chamber 1, by a robot arm (not shown), gas for a thin film process enters and is diffused in a buffer space 5, which is located above a shower head 4, through a gas inlet pipe 7. The gas diffused in the buffer space 5 is uniformly sprayed over the substrate 3 through spray nozzles 4a of the shower head 4, and the sprayed gas is transformed to a state of plasma 8 by RF (Radio Frequency) power that is supplied through a plasma electrode 6. The reaction gas in the state of plasma 8 is deposited onto the substrate 3, and any reaction gas remaining after completion of the thin film deposition process is discharged through an outlet pipe 9 by a vacuum pump (not shown).

However, as shown in FIG. 2, the shower head 4 in the PECVD apparatus has a problem of sagging in the middle due to its own weight and thermal deformation. The thermal deformation is caused by thermal expansion due to heat transfer from the high-temperature plasma and a heater (not shown) installed in the susceptor 2, and the thermal expansion is greater in horizontal directions than in vertical (thickness) directions.

When the middle of the shower head 4 is sagged and thus warped, the distance between the shower head 4 and the susceptor 2 becomes closer in the middle than in the peripheral areas, making the distribution density of the sprayed gas ununiform and deteriorating the process uniformity.

DISCLOSURE

Technical Problem

The present invention provides an apparatus for chemical vapor deposition that can allow a smooth flow of process gas and minimize a thermal expansion distortion of a shower head.

Technical Solution

An aspect of the present invention features an apparatus for chemical vapor deposition, which includes: a process chamber configured to demarcate a reaction space; a back plate placed above the reaction space and having a gas inlet in a middle thereof; a gas diffusion member arranged below and separated from the gas inlet and coupled to the back plate by a first coupling member and configured to diffuse process gas supplied through the gas inlet; a shower head placed below and separated from the back plate and the gas diffusion member and having a middle part thereof coupled to the gas diffusion member by a second coupling member and having a plurality of spray holes perforated therein; and a susceptor arranged below and separated from the shower head and supporting a substrate. The gas diffusion member can have a plurality of gas guiding holes formed therein such that the process gas supplied through the gas inlet is diffused toward a lower side of the gas diffusion member, the plurality of gas guiding holes vertically penetrating the gas diffusion member.

The plurality of gas guiding holes can be arranged at regular intervals along a circumference of a circle about a center of the gas diffusion member.

The gas diffusion member can include: a support plate; and a protrusion member formed on an upper surface of the support plate.

The gas guiding holes can be formed in the protrusion member.

A ring-shaped diffusion channel connecting bottom parts of the gas guiding holes can be formed in the gas diffusion member.

The diffusion channel can have a cross section in the shape of a rectangle that becomes wider toward a lower side.

The apparatus can also include a diffusion plate installed on a lower surface of the gas diffusion member so as to cover the diffusion channel. A plurality of diffusion holes off-centered from centers of the gas guiding holes can be formed in the diffusion plate.

The number of diffusion holes can be greater than the number of gas guiding holes.

The plurality of diffusion holes can be arranged at regular intervals along a circumference of a circle about a center of the gas diffusion member.

A receiving groove in which the diffusion plate is received can be formed on a lower surface of the gas diffusion member.

Cross-sectional areas of upper ends of the diffusion holes can increase toward their upper sides.

Cross-sectional areas of lower ends of the diffusion holes can increase toward their lower sides.

A lateral side of the support plate can be tilted toward a center of the support plate.

The process chamber can have a hexahedral shape, and the support plate can have a disk shape. The protrusion member can have a rectangular cone shape, and lateral sides of the protrusion member can respectively face corners of the process chamber.

The first coupling member can be placed on a linear path that passes through a corner of the protrusion member from a center of the protrusion member.

The process chamber can have a hexahedral shape, and the support plate can have a rectangular plate shape, and the protrusion member can have a circular cone shape. Lateral sides of the support plate can respectively face corners of the process chamber.

The first coupling member can be placed on a linear path that passes through a corner of the support plate from a center of the protrusion member.

At least one of the first coupling member and the second coupling member can be a screw.

The apparatus can also include a clamp member coupled to the back plate through a third coupling member so as to support a brim of the shower head and placed on a lateral side of the shower head with a predetermined gap therebetween.

The apparatus can also include a thermal resistance member interposed between the clamp member and the back plate and having one side thereof being in contact with a lower surface of the back plate and the other side thereof being in contact with an upper surface of the shower head.

The clamp member can include a horizontal part for supporting a lower surface of the shower head and a vertical part for supporting a lateral surface of the shower head, and a lower portion of the brim of the shower head can have a groove formed therein for engagement with the horizontal part of the clamp member.

The thermal resistance member can be a thin metal plate.

The thermal resistance member can be made of aluminum or aluminum alloy.

An oval-shaped long hole can be formed in the brim of the shower head, and the apparatus can also include a fourth coupling member inserted in the long hole by penetrating the horizontal part of the clamp member.

The shower head can have a rectangular plate shape, and the clamp member, the oval long hole and the fourth coupling member can be arranged on every lateral side of the shower head.

The long hole and the coupling member can be arranged in pairs on every lateral side of the shower head.

An expansion cavity having a greater sectional area than the gas inlet can be formed at a lower end portion of the back plate, and at least some of the gas diffusion member can be placed inside the expansion cavity.

A heating wire can be installed inside the susceptor.

The shower head can be made of aluminum or aluminum alloy.

Advantageous Effects

With a preferred embodiment of the present invention, the thermal expansion distortion of the shower head can be minimized, making it possible to obtain a good quality of uniform large-area thin film.

MODE FOR INVENTION

Figure 1:
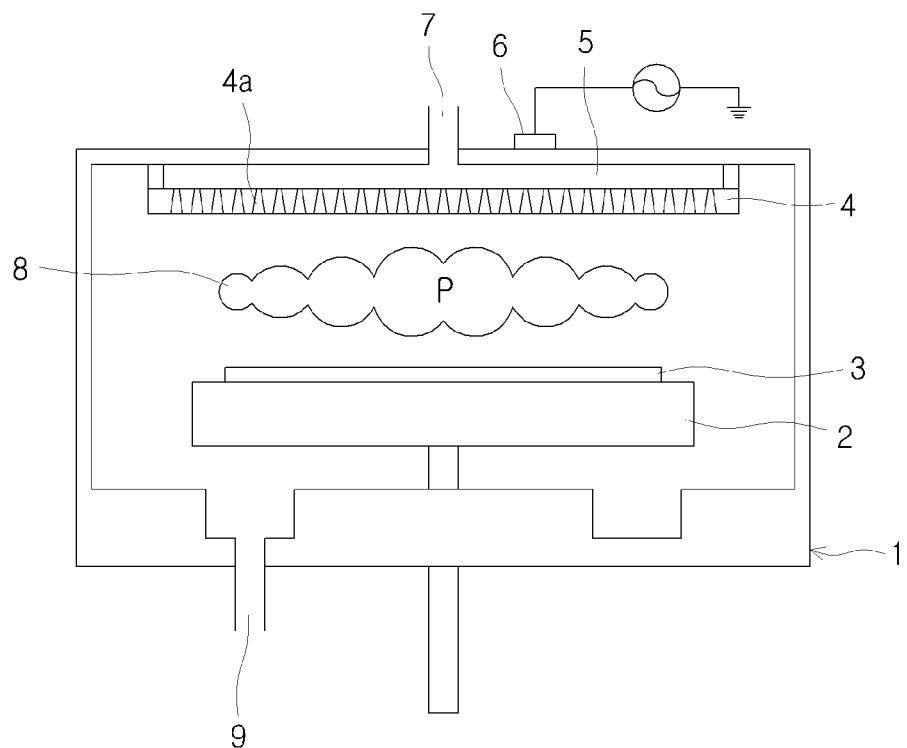
FIG. 1 illustrates a PECVD apparatus in accordance with a conventional technology.
Figure 2:
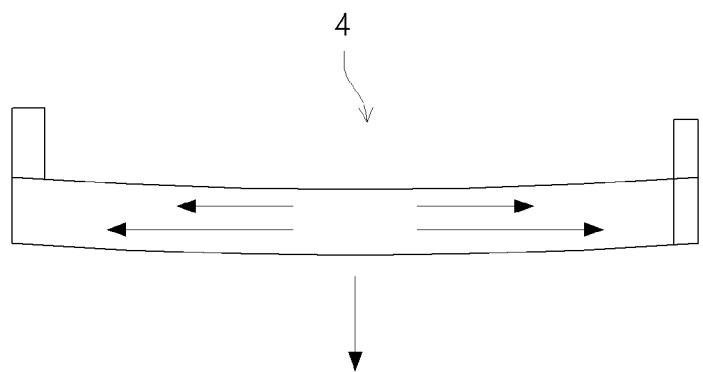
FIG. 2 shows a warping phenomenon of a shower head in accordance with a conventional technology.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in a singular form include a meaning of a plural form. In the present description, an expression such as "comprising" or "including" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, certain preferred embodiments of an apparatus for chemical vapor deposition in accordance with the present invention will be described in detail with reference to the accompanying drawings. Identical or corresponding elements will be given the same reference numerals, regardless of the figure number, and any redundant description of the identical or corresponding elements will not be repeated.

Figure 3:
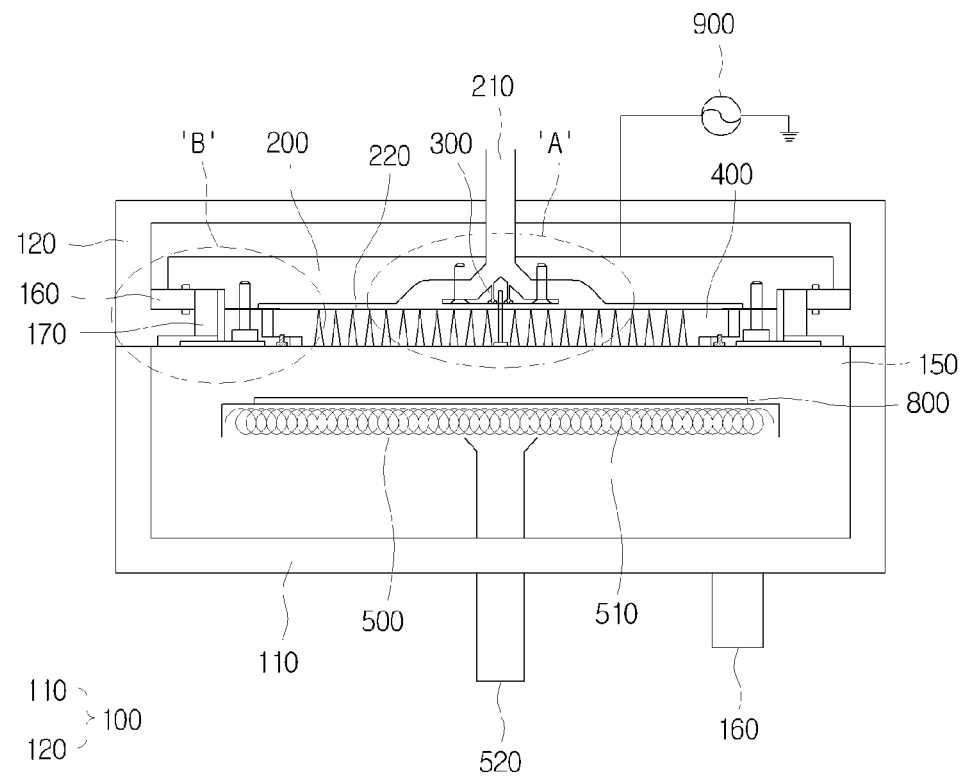
FIG. 3 is a cross-sectional view showing an apparatus for chemical vapor deposition in accordance with an embodiment of the present invention.
Figure 4:
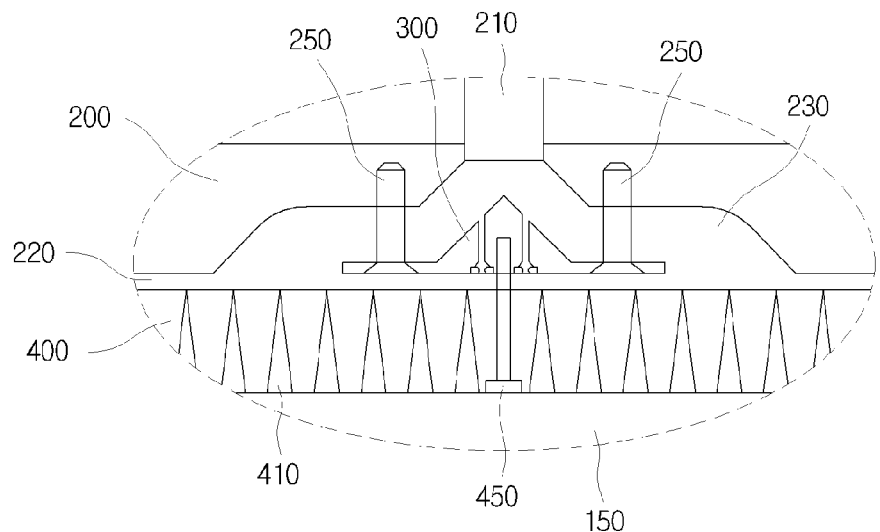
FIG. 4 is an enlarged view of a section marked by "A" in FIG. 3.
Figure 5:
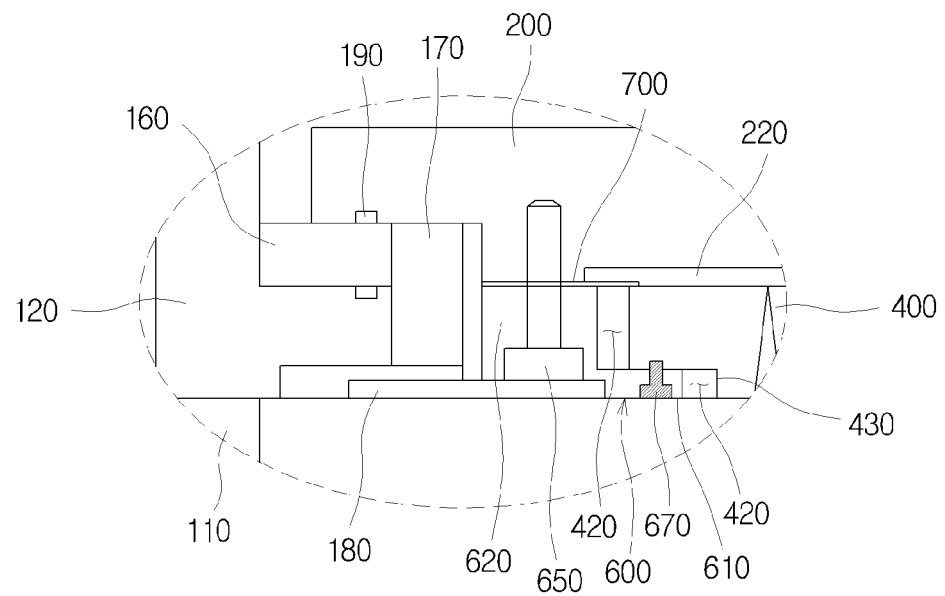
FIG. 5 is an enlarged view of a section marked by "B" in FIG. 3.

FIG. 3 is a cross-sectional view showing an apparatus for PECVD in accordance with an embodiment of the present invention. FIG. 4 is an enlarged view of a section marked by "A" in FIG. 3, and FIG. 5 is an enlarged view of a section marked by "B" in FIG. 3. Shown in FIGS. 3 to 5 are a process chamber 100, a reaction space 150, a back plate 200, a gas inlet 210, a first coupling member 250, a gas diffusion member 300, a shower head 400, a spray hole 410, a second coupling member 450, a long hole 460, a susceptor 500, a clamp member 600, a third coupling member 650, a fourth coupling member 670, a thermal resistance member 700 and a substrate 800.

As shown in FIG. 3, the apparatus for CVD in accordance with the present embodiment includes: the process chamber 100 that demarcates the reaction space 150; the back plate 200 placed above the reaction space 150 and having the gas inlet 210 in the middle thereof; the gas diffusion member 300 arranged below and separated from the gas inlet 210 and configured to diffuse process gas flowed in through the gas inlet 210; the shower head 400 placed below and separated from the back plate 200 and the gas diffusion member 300 and having a plurality of the spray holes 410 perforated therein; and the susceptor 500 arranged below and separated from the shower head 400 and supporting the substrate 800.

The gas diffusion member 300 is coupled with the back plate 200 by the first coupling member 250, and a middle part of the shower head 400 is coupled with the gas diffusion member 300 by the second coupling member 450. In other words, the middle part of the shower head 400 is coupled with the back plate 200 by way of the gas diffusion member 300. According to the present embodiment with such configuration, the problem of the middle part of the shower head 400 sagging due to thermal expansion can be solved.

More specifically, as illustrated in FIG. 4, the gas diffusion member 300 is coupled with the back plate 200 by the first coupling member 250, such as a screw, which penetrates a brim of the gas diffusion member 300 while the gas diffusion member 300 is separated from the back plate 200 by a predetermined distance. Moreover, the gas diffusion member 300 is coupled with the shower head 400 by the second coupling member 450, such as a screw, while the gas diffusion member 300 is separated from the shower head 400 by a predetermined distance. Here, an end part of the second coupling member can be inserted into a middle of the gas diffusion member 300 by penetrating the shower head 400.

Although the present embodiments suggests screws for the first coupling member 250 and the second coupling member, the present invention shall not be restricted to what is suggested in the present embodiment, and any member (e.g., a pin) can be used as long as the gas diffusion member 300 can be fastened while being separated from the back plate 200 and the shower head 400.

The process chamber 100 demarcates the reaction space 150 that is in a vacuum state. The process chamber 100 is mainly divided into an upper cover 120 and a chamber body 110, and a sealing member (not shown), such as an O-ring, is interposed therebetween to seal the reaction space 150 within the process chamber 100 from the outside.

The back plate 200 is located on an upper side of the reaction space 150, more specifically in a space demarcated by the upper cover 120. The back plate 200 can be made of metal, such as aluminum, and the gas inlet 210 for injecting process gas is arranged in the middle thereof. The gas inlet 210 can be a hole that penetrates the back plate 200 or a pipe that is inserted in the hole. The process gas supplied from an external gas source (not shown) can be injected below the back plate 200 through the gas inlet 210.

The gas diffusion member 300 for diffusing the supplied process gas is located below the back plate 200, more specifically below the gas inlet 210 arranged in the back plate 200, as illustrated in FIG. 4. As described earlier, the gas diffusion member 300 is fixed while the gas diffusion member 300 is separated from the back plate 200 by the first coupling member 250.

The gas diffusion member 300 is for effectively diffusing the injected process gas inside the process chamber 100, more specifically in a space 200 between the back plate 200 and the shower head 400 (referred to as "buffer space" hereinafter). For this, it is important that the injected process gas has a laminar flow. The specific shape and function of the gas diffusion member 300 will be described later.

As illustrated in FIG. 4, an expansion cavity 230, which has a greater sectional area than the gas inlet 210, can be formed at a lower end portion of the back plate 200, and some or all of the gas diffusion member 300 can be placed inside the expansion cavity 230. Here, the expansion cavity 230 and the gas diffusion member 300 can have a similar shape.

The shower head 400 is arranged below the back plate 200 and the gas diffusion member 300 by being separated from the back plate 200 and the gas diffusion member 300. The shower head 400 is a means for diffusing the injected project gas and spraying the process gas evenly on an entire surface of the substrate placed over the susceptor 500, and can have a similar shape to the sectional shape of the process chamber 100. For example, if the process chamber 100 has a hexahedral shape and thus has a rectangular sectional shape, the shower head 400 can have the shape of a rectangular board. The shower head 400 can also have the spray holes 410 that are evenly perforated in its body in the shape of a board made of metal, such as aluminum. Here, the spray holes 410 can have the shape of a cone, of which the sectional area becomes gradually larger toward its lower side.

Owing to the above-described structure, the injected process gas is primarily diffused by the gas diffusion member 300 formed below the back plate 200 and then secondarily diffused by the shower head 400, and thus can be evenly sprayed on an upper surface of the substrate 800 received on an upper surface of the susceptor 500.

Here, RF power 900 is connected with the back plate 200 and the shower head 400 and supplies energy required for exciting the sprayed process gas to transform the process gas sprayed through the shower head 400 to plasma. In other words, the back plate 200 and the shower head 400 can function as an upper electrode.

As the process chamber 100, more specifically the upper cover 120, functions as ground, as illustrated in FIG. 5, insulators 160, 170, 180 are interposed between the back plate and the shower head, which function as the upper electrode, and the upper cover 120, maintaining electrical insulation between them. Here, an O-ring 190 is arranged at a predetermined location of the insulator 160 so as to maintain the vacuum state of the reaction space 150.

In a manufacturing process of a crystalline silicon solar cell, a silicon nitride (SiNx) membrane is mainly used as an antireflection film, and the process can be performed by injecting SiH4 and NH3 as the process gas in order to form this kind of antireflection film.

As illustrated in FIG. 5, the brim of the shower head 400 can be supported by the clamp member 600, which consists of a horizontal part 610 for supporting a lower surface of the shower head 400 and a vertical part 620 for supporting a lateral surface of the shower head 400. Here, a lower portion of the brim of the shower head 400 can be formed with a groove 430 for engagement with a lower portion of the clamp member, i.e., the horizontal part 610.

The clamp member 600, for example, the vertical part 620 of the clamp member 600, can be coupled with the back plate 200 by the third coupling member 650, such as a screw, and the horizontal part 610 of the clamp member 600 can support the lower surface of the shower head 400 by being engaged with the lower surface of the shower head 400.

A predetermined gap 420 can be formed between the lateral side of the shower head 400 and the clamp member 600. This gap 420 is formed in consideration of thermal expansion of the shower head 400.

Figure 6:
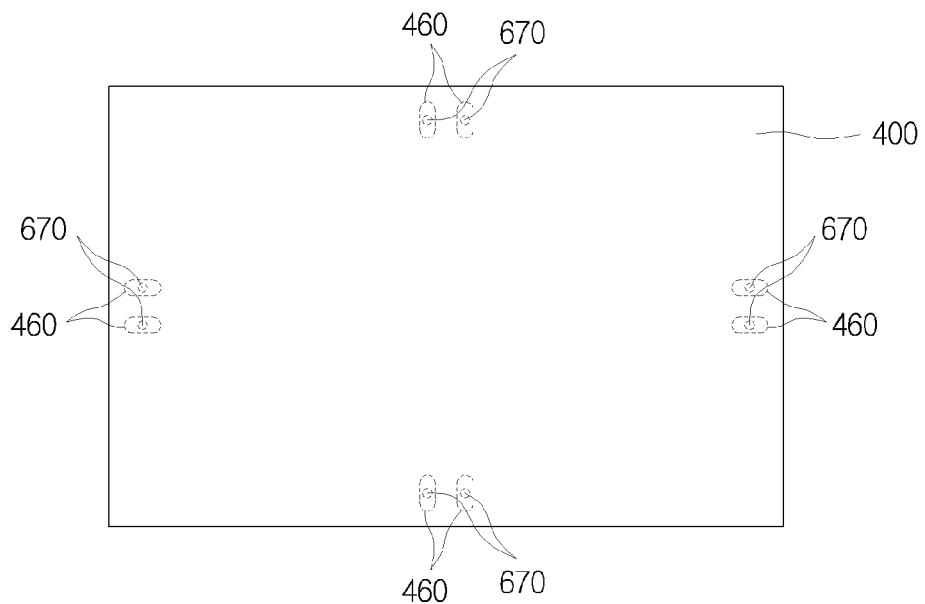
FIG. 6 is a top view of a shower head having long holes formed therein.

As illustrated in FIG. 6, the oval-shaped long hole 460 is formed in the brim of the shower head 400, and the fourth coupling member 670 can be inserted in the long hole 460 by penetrating the horizontal part 610 of the clamp member 600. The fourth coupling member 670 is a means for supporting the brim of the shower head 400 by coupling the clamp member 600 with the shower head 400. It shall be appreciated that various coupling means, such as a screw, a pin, etc., can be used for the fourth coupling member 670.

The shower head 400 has the long holes 460 formed therein, as illustrated in FIG. 6. By forming these long holes 460, it is possible to prevent excessive stress from being exerted on the shower head 400 due to the presence of the fourth coupling member 670, in spite of thermal expansion of the shower head 400. This is because an extra space in the long holes 460 can function as a reserve space in consideration of thermal expansion of the shower head 400.

If the shower head 400 is in a rectangular board shape, the clamp member 600, the oval long hole 460 and the fourth coupling member 670 can be arranged on each lateral side of the shower head 400. In other words, the brims of the shower head 400 can be more securely supported by forming the clamp member 600 and the fourth coupling member 670 on every lateral side of the shower head 400.

As illustrated in FIG. 6, the long hole 460 and the fourth coupling member 670 are arranged in pairs on every lateral side of the shower head 400 and thus can support the shower head 400 more securely.

Moreover, the thermal resistance member 700 can be interposed in between the clamp member 600 and the back plate 200. As illustrated in FIG. 5, one side of the thermal resistance member 700 is in contact with a lower surface of the back plate 200, and the other side of the thermal resistance member 700 is in contact with an upper surface of the shower head 400, and thus the thermal resistance member 700 can function as resistance in heat transfer between the shower head 400 and the back plate 200. Owing to the role that the thermal resistance member 700 plays, it is possible to reduce the heat transferred from the shower head 400 to the back plate 200. A thin metal plate, made of a material such as aluminum, can be used for the thermal resistance member 700. The thickness of the thermal resistance member 700 can be between about 1.5 mm and 3.0 mm.

The susceptor 500, on which the substrate 800 is received, is placed below the shower head 400 by being separated from the shower head 400. A heater 510 can be laid inside the susceptor 500, in which case the substrate 800 received over the susceptor 500 can be heated to a temperature (e.g., 400° C.) that is suitable for deposition during the thin film deposition process. Moreover, the susceptor 500 is electrically grounded and thus can function as a lower electrode, and it is also possible to elevate and lower the susceptor 500 by a separate elevation means 520 for loading and unloading the substrate 800.

An exhaust outlet 130 can be arranged below the process chamber 100, more specifically beneath the susceptor 500, such that process gas remaining inside the process chamber 100 can be discharged to the outside after the deposition reaction is completed.

Figure 7:
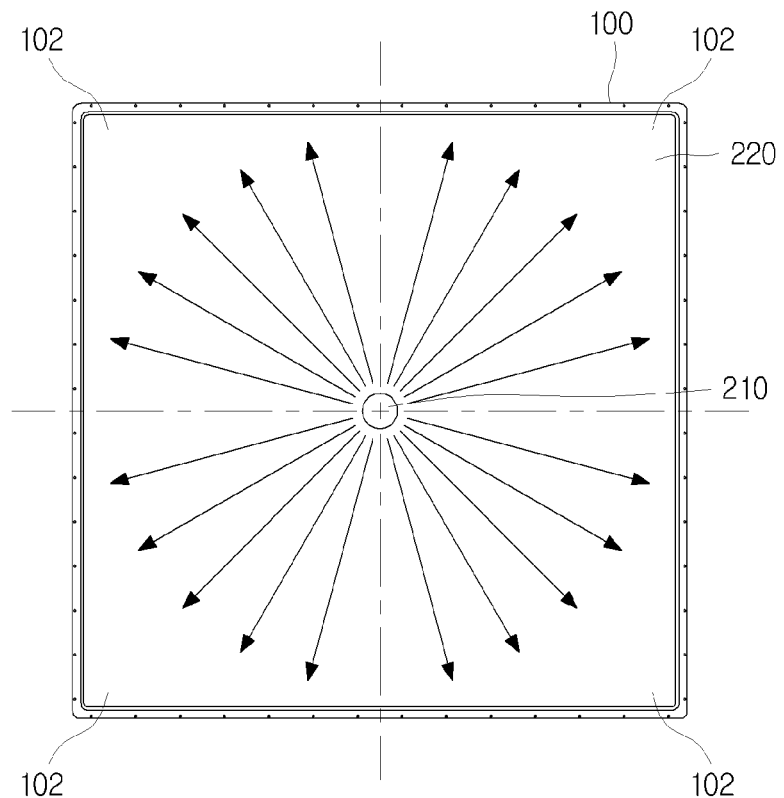
FIG. 7 shows how process gas flowed in a vacuum container through a gas inlet is diffused in a PECVD apparatus in accordance with a conventional technology.

Hereinafter, the shape and function of the earlier-described gas diffusion member 300 will be described in more detail. FIG. 7 shows how the process gas flowed in the process chamber 100, more specifically in the buffer space 220, through the gas inlet 210 is diffused in the conventional PECVD apparatus. Here, the arrows indicate the diffused process gas.

In order to form a uniform thin film on the substrate 800, it is important that the process gas is uniformly supplied throughout the substrate 800. For this, it is required that the process gas supplied to an upper side of the shower head 400 through the gas inlet 210 is evenly distributed throughout the shower head 400. However, according to the conventional technology, as shown in FIG. 7, corner areas 102 of the process chamber 100, which has a hexahedral shape, are located at a far distance from the gas inlet 210 located in the middle of the process chamber 100, limiting the process gas from being evenly distributed throughout the process chamber 100.

Figure 8:
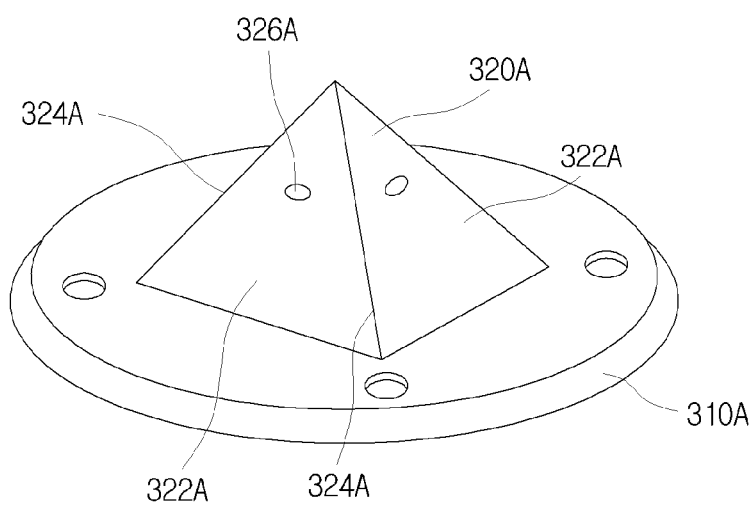
FIG. 8 is a perspective view showing a gas diffusion member in accordance with an embodiment of the present invention.

Considering the above, as illustrated in FIG. 8, the present embodiment presents a gas diffusion member 300A, which includes a support plate 310A in the shape of a disk and a protrusion member 320A, in the shape of a cone, formed in the middle of an upper surface of the support plate 310A. Here, each lateral side 322A of the protrusion member 320A is arranged to face each corner area 102 of the process chamber 100.

Figure 9:
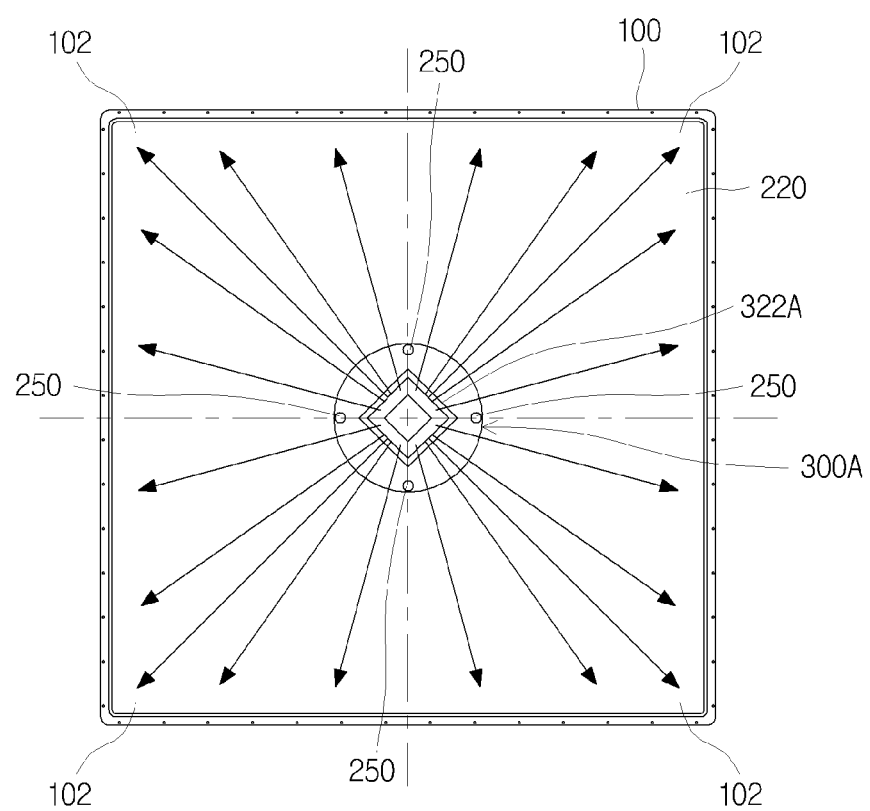
FIG. 9 shows how process gas flowed in a vacuum container through a gas inlet is diffused in a PECVD apparatus in which the gas diffusion member of FIG. 8 is applied.

In the present embodiment, corners 324A of the protrusion member 320 can function as resistance that impedes the flow of the process gas, and thus by allowing the lateral sides 322A of the protrusion member 320A to face the corner areas 102 of the process chamber 100, as illustrated in FIG. 9, compensation of the process gas for the corner areas 102 of the process chamber 100 becomes possible.

Here, as shown in FIG. 9, by placing the first coupling members 250 on linear paths that pass through the corners 324A of the protrusion member 320A from the center of the protrusion member 320A, the first coupling members 250 become to function as resistance to the movement of the process gas, making it possible to allow the process gas to flow more smoothly in the directions of the corner areas 102 of the process chamber 100.

As such, by allowing the process gas to flow more smoothly in the directions of the corner areas 102 of the process chamber 100 that are relatively farther by modifying the shape of the gas diffusion member, the process gas can be compensated for the corner areas 102 of the process chamber 100, thereby resulting in an improved overall uniformity of the process gas in the buffer space 220, furthermore in the process chamber 100.

The lateral side of the support plate 310A can be formed to be tilted toward the center of the support plate 310A, as illustrated in FIG. 8. More specifically, a tilted surface is formed from an upper part to a lower part on a boundary of the support plate 310A, and this tilted surface can have a convexly-curved shape (see FIG. 13), and thus the process gas passing the support plate 310A through the protrusion member 320A can flow more smoothly along this tilted surface.

Figure 10:
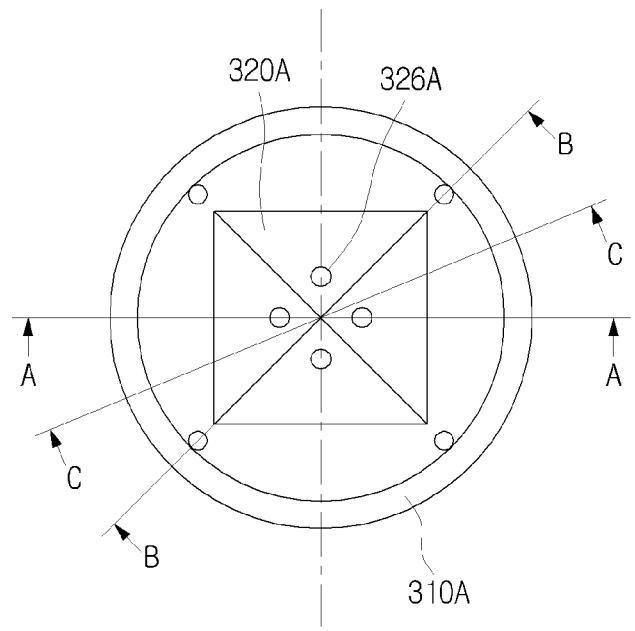
FIG. 10 is a top view of a gas diffusion member in accordance with an embodiment of the present invention.

As illustrated in FIGS. 8 and 10, the gas diffusion member 300A can be formed with a plurality of gas guiding holes 326A that penetrate the gas diffusion member 300A vertically. Accordingly, the process gas supplied through the gas inlet 210 can be diffused through the gas guiding holes 326A as well as the surface of the gas diffusion member 300A, and thus it becomes possible that the process gas can be diffused effectively not only along the circumference of the gas diffusion member 300A but also toward a lower side of the gas diffusion member 300A.

As illustrated in FIG. 10, the gas guiding holes 326A can be arranged at regular intervals along the circumference of a circle about the center of the gas diffusion member 300A. That is, the gas guiding holes 326A can be arranged at regular intervals on an imaginary circle that is placed at the center of the gas diffusion member 300A. For example, as illustrated in FIG. 10, there can be 4 gas guiding holes 326A formed in the protrusion member 320A.

Figure 11:
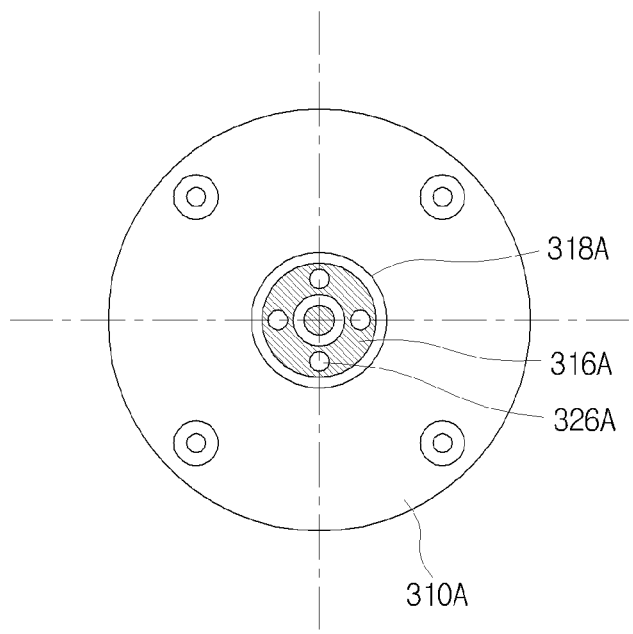
FIG. 11 is a bottom view showing the gas diffusion member with a diffusion plate removed in accordance with an embodiment of the present invention.

Bottom parts of the gas guiding holes 326A can be connected by a ring-shaped diffusion channel 316A formed on a lower surface of the gas diffusion member 300A, as illustrated in FIG. 11. Also as illustrated in FIG. 11, the lower surface of the gas diffusion member 300A is formed with a receiving groove 318A for receiving a diffusion plate 330A, and as illustrated in FIG. 12, the diffusion plate 330A, in which diffusion holes 332A are formed, can be installed in the receiving groove 318A so as to cover the diffusion channel 316A.

As such, by forming the diffusion channel 316A connecting the gas guiding holes 326A on the bottom parts of the gas guiding holes 326A and installing the diffusion plate 330A on the lower surface of the gas diffusion member 300A so as to cover the diffusion channel 316A, the process gas flowed in through upper parts of the gas guiding holes 326A cannot be directly discharged toward the lower side of the gas diffusion member 300A but can be discharged toward the lower side of the gas diffusion member 300A by the plurality of the diffusion holes 332A after primarily being gathered in a space defined by the diffusion channel 316A and the diffusion plate 330A, thereby making it possible for the process gas flowed in through the gas guiding holes 326A to be more uniformly discharged toward the lower side of the gas diffusion member 300A.

Figure 12:
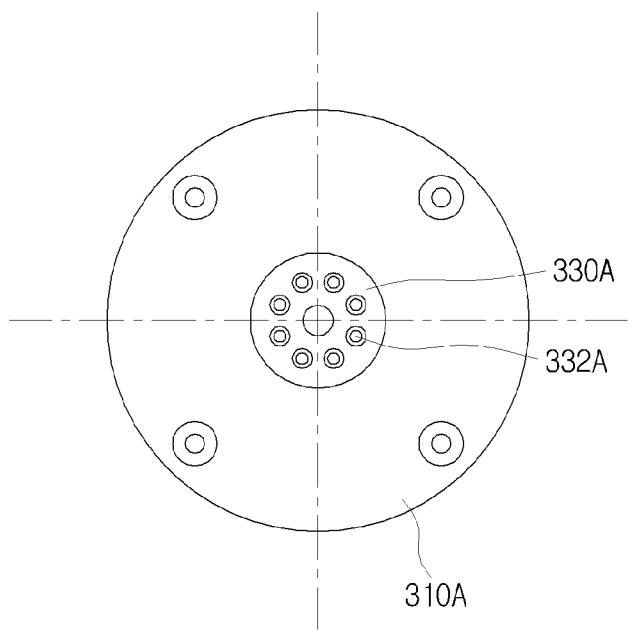
FIG. 12 is a bottom view of the gas diffusion member in accordance with an embodiment of the present invention.

In such a case, as illustrated in FIG. 12, the diffusion holes 332A can be arranged at regular intervals along the circumference of a circle about the center of the gas diffusion member 300A, similarly to the gas guiding holes 326A, but as it can be seen in FIGS. 10 and 12, the diffusion holes 332A can be formed to be off-center from the centers of the gas guiding holes 326A, and there can be more diffusion holes 332A than the gas guiding holes 326A. For example, there can be 8 diffusion holes 332A for 4 gas guiding holes 326A, as shown in FIGS. 10 and 12.

As such, by arranging the diffusion holes 332A at different planar locations of the gas guiding holes 326A and forming a greater number of the diffusion holes 332A than the number of the gas guiding holes 326A, the process gas gathered in the diffusion channel 316A can be diffused more uniformly toward the lower side of the gas diffusion member 300A through the plurality of uniformly-distributed diffusion holes 332A.

Hereinafter, flow of the process gas through an upper surface of the gas diffusion member 300A and the gas guiding holes 326A will be described with reference to FIGS. 13 to 16.

Figure 13:
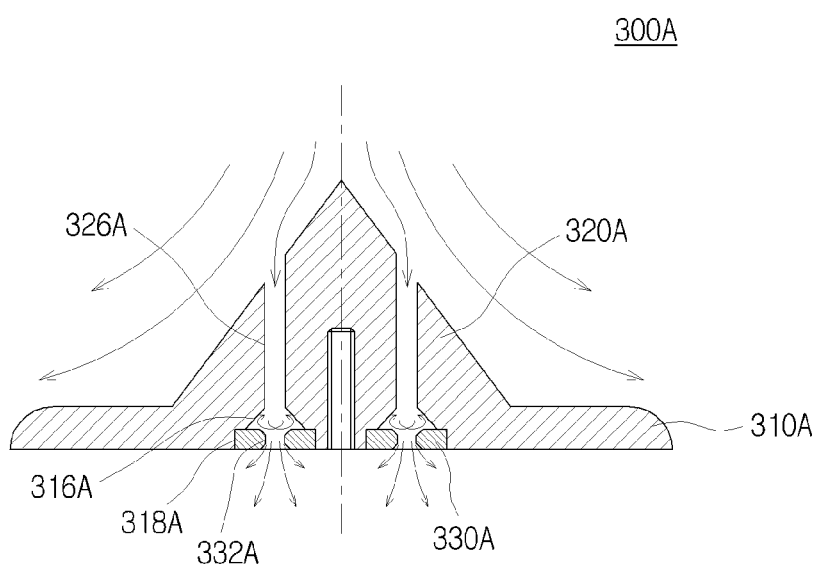
FIG. 13 shows how process gas flows through the gas diffusion member in accordance with an embodiment of the present invention.

FIG. 13 illustrates the principle of how process gas flows through the gas diffusion member 300A. FIG. 13, however, is not intended to show a relation of specific arrangement of the gas guiding holes 326A, the diffusion channel 316A and the diffusion holes 332A, and their specific arrangement relation can be understood through FIGS. 14 to 16, which are respective cross-sectional views of FIG. 12 along the A-A, B-B and C-C lines, respectively.

Figure 14:
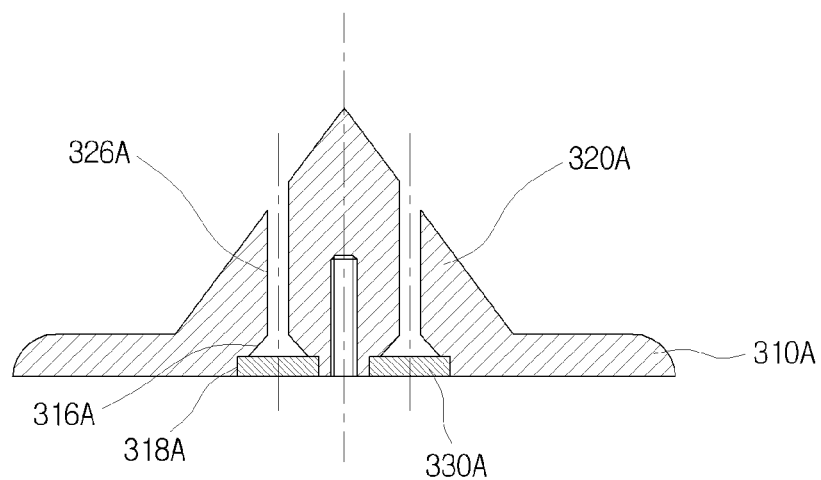
FIG. 14 is a cross-sectional view of FIG. 10 along the A-A line.

The process gas supplied through the gas inlet 210 is flowed in through the gas guiding holes 326A as well as the upper surface of the gas diffusion member 300A, as illustrated in FIG. 13. As illustrated in FIGS. 13 and 14, the process gas flowed in through the upper parts of the gas guiding holes 326A moves toward the ring-shaped diffusion channel 316A that connects the bottom parts of the gas guiding holes 326A.

Figure 15:
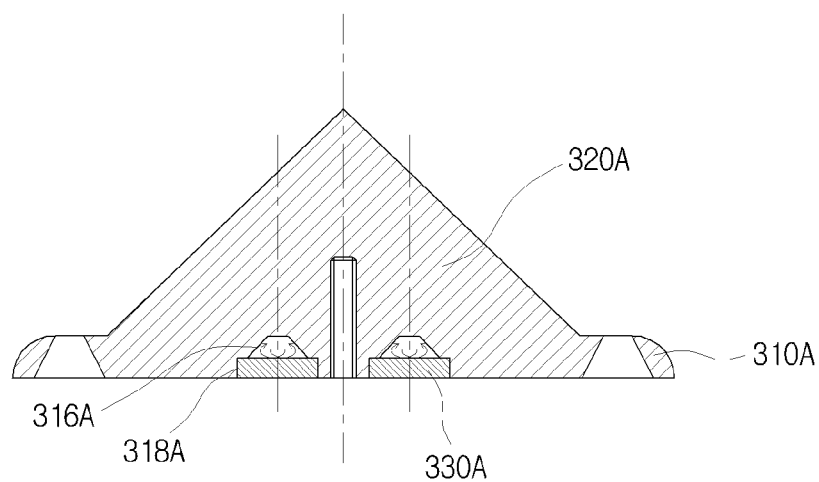
FIG. 15 is a cross-sectional view of FIG. 10 along the B-B line.

The process gas having arrived at the diffusion channel 316A as described above primarily stays at the diffusion channel 316A, which is blocked by the diffusion plate 330A, for more uniform diffusion, as illustrated in FIGS. 13 and 15.

In such a case, the diffusion channel 316A can have a cross section in the shape of a rectangle that becomes wider toward its lower side, as illustrated in FIGS. 13 and 15. The diffusion channel 316A, which is a ring-shaped element that is formed by rotating and symmetrizing, for example, a trapezoidal cross-section about the center of the gas diffusion member 300A, can reduce the flow speed of the process gas flowed in because its cross-sectional area increases toward its bottom, and accordingly the process gas can be diffused more uniformly by this diffusion channel 316A.

Figure 16:
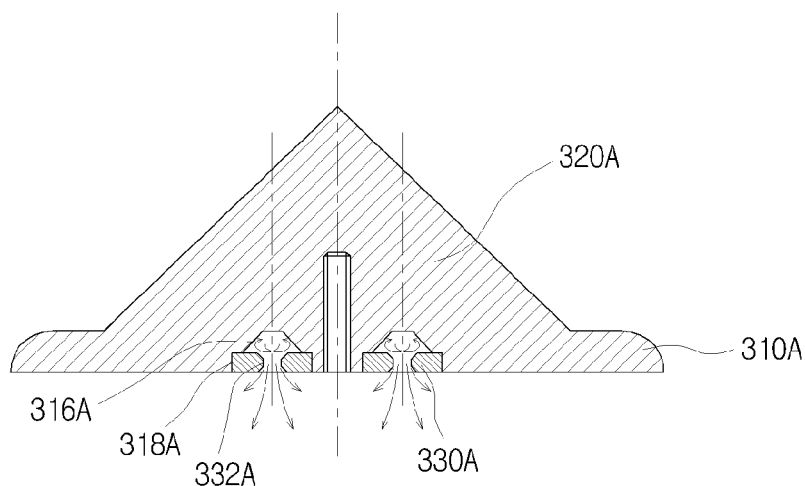
FIG. 16 is a cross-sectional view of FIG. 10 along the C-C line.

Then, the process gas inside the diffusion channel 316A can be discharged toward the lower side of the gas diffusion member 300A through the diffusion holes 332A, which are formed in a greater number than the gas guiding holes 326A and are off-center from the center of the gas guiding holes 326A, as illustrated in FIGS. 13 and 16.

In this case, as illustrated in FIGS. 13 and 16, cross-sectional areas of upper ends of the diffusion holes 322A can increase toward their upper sides, and cross-sectional areas of lower ends of the diffusion holes 322A can increase toward their lower sides. By having a mortar shape in which the cross-sectional areas of the diffusion holes 322A gradually decreases and increases again from the upper parts to the lower parts, it becomes possible for the process gas flowed in from the diffusion channel 316A to flow stably along inner walls of the diffusion holes 332A, and accordingly, forming of a vortex inside the process gas can be minimized.

Figure 17:
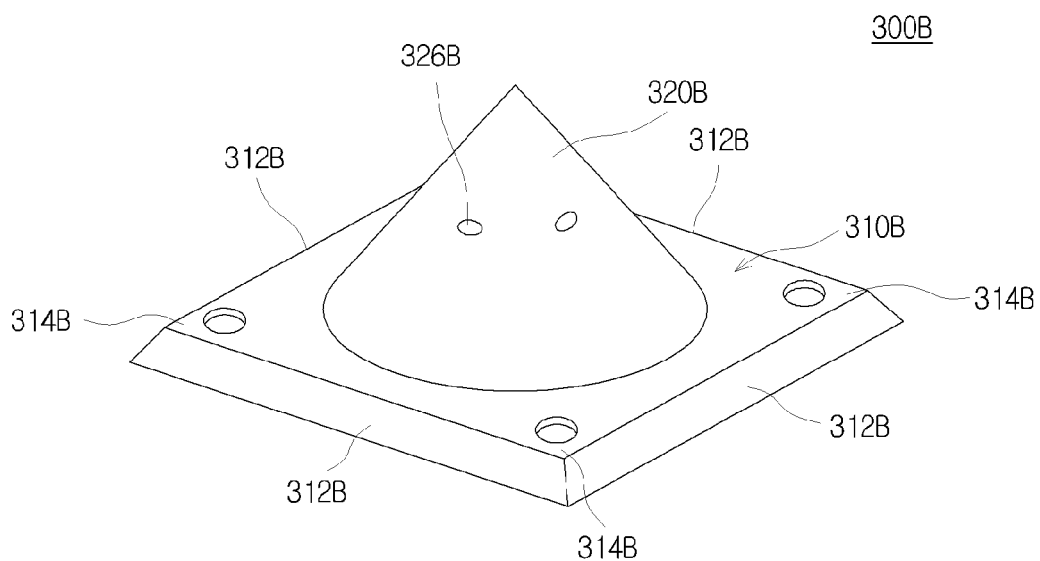
FIG. 17 is a perspective view showing a gas diffusion member in accordance with another embodiment of the present invention.

In another embodiment, as illustrated in FIG. 17, a gas diffusion member 300B including a support plate 310B in the shape of a rectangular plate and a cone-shaped protrusion member 320B formed on an upper surface of the support plate 310B can be used. Here, each lateral side 312B of the support plate 310B faces each corner 102 of the process chamber 100.

Figure 18:
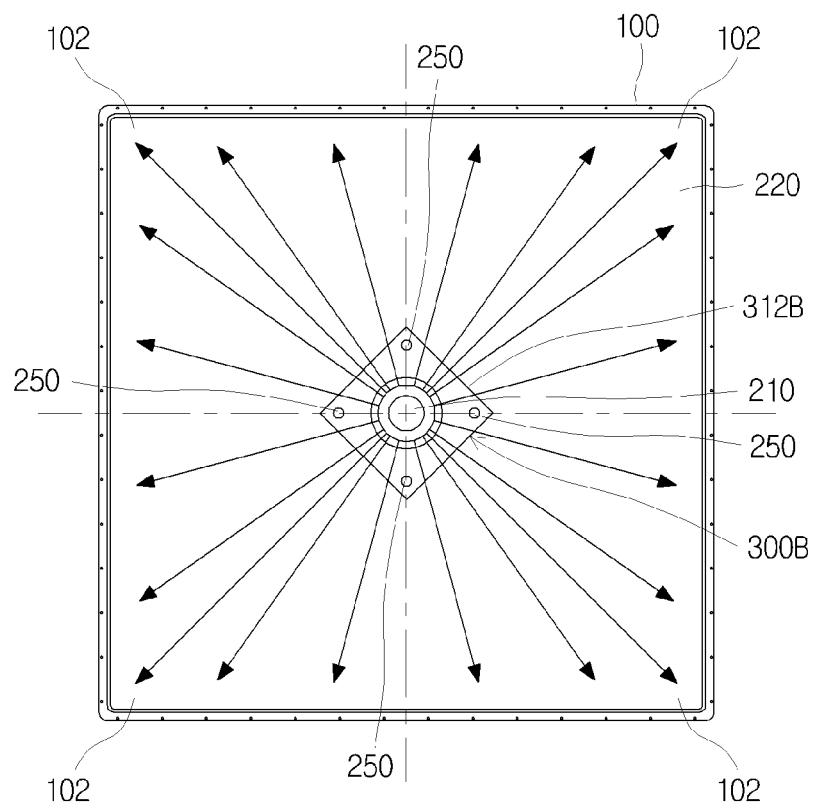
FIG. 18 shows how process gas flowed in a vacuum container through a gas inlet is diffused in a PECVD apparatus in which the gas diffusion member of FIG. 17 is applied.

By using the above-described gas diffusion member 300B, the process gas supplied through the gas inlet 210 initially descends evenly in all four directions along the lateral sides of the cone-shaped protrusion member 320B and then moves along the upper surface of the support plate 310B, as illustrated in FIG. 18. Here, since the upper surface of the support plate 310B works as resistance to the movement of the process gas, the process gas flows smoothly in the directions of the lateral sides 312B of the support plate 310B, which are relatively shorter from the center (i.e., less resistance) and does not flow smoothly in the directions of corners 314B of the support plate 310B, which are relatively farther from the center (i.e., more resistance).

Here, as illustrated in FIG. 18, by placing the first coupling members 250 on linear paths that pass through the corners 314B of the support plate 310B from the center of the cone-shaped protrusion member 320B, the first coupling members 250 become to function as resistance to the movement of the process gas, making it possible to allow the process gas to flow more smoothly in the directions of the lateral sides 312B of the support plate 310B.

Figure 19:
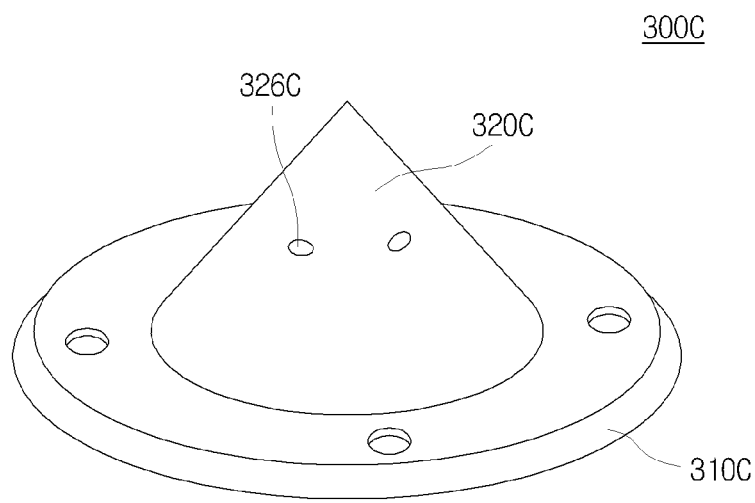
FIG. 19 is a perspective view showing a gas diffusion member in accordance with yet another embodiment of the present invention.

In yet another embodiment, as illustrated in FIG. 19, a gas diffusion member 300C including a disk-shaped support plate 310C and a cone-shaped protrusion member 320C formed on an upper surface of the support plate 310C can be used.

Similarly to the earlier-described embodiments, this gas diffusion member 300C can have gas guiding holes 326C and a diffusion channel therein, and a diffusion plate, in which diffusion holes are formed, can be installed in a receiving groove on a lower surface of the gas diffusion member 300C.

Although certain preferred embodiments of the present invention have been described, it shall be appreciated that various modifications and permutations of the present invention are possible by those who are skilled in the art to which the present invention pertains without departing from the technical ideas and scope of the present invention.

It shall be also appreciated that there can be many other embodiments than the above described embodiments in the claims of the present invention.

DESCRIPTION OF ELEMENTS

100: process chamber
110: chamber body
120: upper cover
150: reaction space
200: back plate
210: gas inlet
220: buffer space
230: expansion cavity
250: first coupling member
300A, 300B, 300C: gas diffusion member
400: shower head
410: spray hole
450: second coupling member
460: long hole
500: susceptor
600: clamp member
610: horizontal part
620: vertical part
650: third coupling member
670: fourth coupling member
700: thermal resistance member
800: substrate

The invention claimed is:

1. An apparatus for chemical vapor deposition, comprising:
a process chamber configured to demarcate a reaction space;
a back plate placed above the reaction space and having a gas inlet in a middle thereof;
a gas diffusion member arranged below and separated from the gas inlet and coupled to the back plate by a first coupling member and configured to diffuse process gas supplied through the gas inlet;
a shower head placed below and separated from the back plate and the gas diffusion member and having a middle part thereof coupled to the gas diffusion member by a second coupling member and having a plurality of spray holes perforated therein; and
a susceptor arranged below and separated from the shower head and supporting a substrate,
wherein the gas diffusion member has a plurality of gas guiding holes formed therein such that the process gas supplied through the gas inlet is diffused toward a lower side of the gas diffusion member, the plurality of gas guiding holes vertically penetrating the gas diffusion member;
wherein the gas diffusion member comprises a support plate; and a protrusion member formed on an upper surface of the support plate;
wherein the gas guiding holes are formed in the protrusion member; and
wherein a ring-shaped diffusion channel connecting bottom parts of the gas guiding holes is formed in the gas diffusion member and a diffusion plate installed on a lower surface of the gas diffusion member so as to cover the diffusion channel, wherein a plurality of diffusion holes off-centered from centers of the gas guiding holes are formed in the diffusion plate.

2. The apparatus of claim 1, wherein the plurality of gas guiding holes are arranged at regular intervals along a circumference of a circle about a center of the gas diffusion member.

3. The apparatus of claim 1, wherein the diffusion channel has a cross section in the shape of a rectangle that becomes wider toward a lower side.

4. The apparatus of claim 1, wherein the number of diffusion holes is greater than the number of gas guiding holes.

5. The apparatus of claim 1 wherein the plurality of diffusion holes are arranged at regular intervals along a circumference of a circle about a center of the gas diffusion member.

6. The apparatus of claim 1, wherein a receiving groove in which the diffusion plate is received is formed on a lower surface of the gas diffusion member.

7. The apparatus of claim 1, wherein cross-sectional areas of upper ends of the diffusion holes increase toward their upper sides.

8. The apparatus of claim 1, wherein cross-sectional areas of lower ends of the diffusion holes increase toward their lower sides.

9. The apparatus of claim 1, wherein a lateral side of the support plate is tilted toward a center of the support plate.

10. The apparatus of claim 1, wherein:
the process chamber has a hexahedral shape;
the support plate has a disk shape;
the protrusion member has a rectangular cone shape; and
lateral sides of the protrusion member respectively face corners of the process chamber.

11. The apparatus of claim 10, wherein the first coupling member is placed on a linear path that passes through a corner of the protrusion member from a center of the protrusion member.

12. The apparatus of claim 1, wherein:
the process chamber has a hexahedral shape;
the support plate has a rectangular plate shape;
the protrusion member has a circular cone shape; and
lateral sides of the support plate respectively face corners of the process chamber.

13. The apparatus of claim 12, wherein the first coupling member is placed on a linear path that passes through a corner of the support plate from a center of the protrusion member.

14. The apparatus of claim 1, wherein at least one of the first coupling member and the second coupling member is a screw.

15. The apparatus of claim 1, further comprising a clamp member coupled to the back plate through a third coupling member so as to support a brim of the shower head and placed on a lateral side of the shower head with a predetermined gap therebetween.

16. The apparatus of claim 15, further comprising a thermal resistance member interposed between the clamp member and the back plate and having one side thereof being in contact with a lower surface of the back plate and the other side thereof being in contact with an upper surface of the shower head.

17. The apparatus of claim 15, wherein:
the clamp member comprises a horizontal part for supporting a lower surface of the shower head and a vertical part for supporting a lateral surface of the shower head; and
a lower portion of the brim of the shower head has a groove formed therein for engagement with the horizontal part of the clamp member.

18. The apparatus of claim 17, wherein the thermal resistance member is a thin metal plate.

19. The apparatus of claim 18, wherein the thermal resistance member is made of aluminum or aluminum alloy.

20. The apparatus of claim 17, wherein an oval-shaped long hole is formed in the brim of the shower head, and
further comprising a fourth coupling member inserted in the long hole by penetrating the horizontal part of the clamp member.

21. The apparatus of claim 20, wherein:
the shower head has a rectangular plate shape; and
the clamp member, the oval long hole and the fourth coupling member are arranged on every lateral side of the shower head.

22. The apparatus of claim 21, wherein the long hole and the coupling member are arranged in pairs on every lateral side of the shower head.

23. The apparatus of claim 1, wherein an expansion cavity having a greater sectional area than the gas inlet is formed at a lower end portion of the back plate, and at least some of the gas diffusion member is placed inside the expansion cavity.

24. The apparatus of claim 1, wherein a heating wire is installed inside the susceptor.

25. The apparatus of claim 1, wherein the shower head is made of aluminum or aluminum alloy.

* * * * *